(12) United States Patent
Chaudhary et al.

(10) Patent No.: US 12,003,191 B2
(45) Date of Patent: Jun. 4, 2024

(54) CONTROL FOR A MULTI-LEVEL INVERTER

(71) Applicant: TEXAS INSTRUMENTS INCORPORATED, Dallas, TX (US)

(72) Inventors: Himanshu Chaudhary, Bengaluru (IN); Salil Chellappan, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 17/491,652

(22) Filed: Oct. 1, 2021

(65) Prior Publication Data

US 2022/0109378 A1    Apr. 7, 2022

(30) Foreign Application Priority Data

Oct. 1, 2020 (IN) .............................. 202041042732

(51) Int. Cl.
*H02M 7/487* (2007.01)
*H02M 1/32* (2007.01)
*H02M 1/38* (2007.01)
*H02M 7/5395* (2006.01)

(52) U.S. Cl.
CPC ............. *H02M 7/487* (2013.01); *H02M 1/32* (2013.01); *H02M 1/38* (2013.01); *H02M 7/5395* (2013.01)

(58) Field of Classification Search
CPC .......... H02M 1/32; H02M 1/38; H02M 7/483; H02M 7/487; H02M 7/5395; H03K 5/1515; H03K 7/08
See application file for complete search history.

(56) References Cited

U.S. PATENT DOCUMENTS

| | | | | |
|---|---|---|---|---|
| 11,581,820 | B1* | 2/2023 | Mekonnen | H02M 1/385 |
| 2003/0048650 | A1* | 3/2003 | Asaeda | H02M 7/487 363/98 |
| 2005/0190583 | A1* | 9/2005 | Morimoto | H02M 3/3376 363/24 |
| 2006/0197491 | A1* | 9/2006 | Nojima | H02M 7/487 318/801 |
| 2009/0278621 | A1* | 11/2009 | Kris | H02M 1/38 332/109 |
| 2011/0058399 | A1* | 3/2011 | Honsberg | H02M 7/487 363/97 |
| 2015/0131352 | A1* | 5/2015 | Hart | H02M 7/537 363/131 |
| 2016/0268924 | A1* | 9/2016 | Fu | H02M 7/483 |
| 2018/0159519 | A1* | 6/2018 | Chen | H02M 1/38 |

* cited by examiner

*Primary Examiner* — Fred E Finch, III
(74) *Attorney, Agent, or Firm* — Brian D. Graham; Frank D. Cimino

(57) ABSTRACT

A control circuit for an inverter. The control circuit includes a first pulse width modulation (PWM) module configured to produce first and second complementary PWM signals, and a second PWM module configured to produce a third and fourth complementary PWM signals. PWM switching logic is coupled to the first and second PWM modules and is adapted to be coupled to a switch network. The switch network includes first, second, third, and fourth switches coupled in series between a first voltage terminal and a second voltage terminal. The PWM switching logic is configured to produce control signals for each of the first, second, third, and fourth switches in response to the first and second complementary PWM signals and to the third and fourth complementary PWM signals.

20 Claims, 4 Drawing Sheets

CONTROL FOR A MULTI-LEVEL INVERTER

CROSS-REFERENCE TO RELATED APPLICATIONS

This application claims priority to an Indian Provisional Application No. 202041042732, filed Oct. 1, 2020, which is hereby incorporated by reference.

BACKGROUND

An inverter converts a direct current (DC) voltage to an alternating current (AC) voltage. One class of inverter is a multi-level inverter in which a switch network is connected to positive and negative voltages (with respect to a neutral) and controlled such that multiple voltages are generated on a switch node within the switch network. For a three-level inventor, for example, three voltages are generated on the switch node (positive supply voltage, negative supply voltage, and neutral).

SUMMARY

In one example, a control circuit for an inverter includes a first pulse width modulation (PWM) module configured to produce first and second complementary PWM signals, and a second PWM module configured to produce a third and fourth complementary PWM signals. PWM switching logic is coupled to the first and second PWM modules and is adapted to be coupled to a switch network. The switch network includes first, second, third, and fourth switches coupled in series between a first voltage terminal and a second voltage terminal. The PWM switching logic is configured to produce control signals for each of the first, second, third, and fourth switches in response to the first and second complementary PWM signals and to the third and fourth complementary PWM signals.

BRIEF DESCRIPTION OF THE DRAWINGS

For a detailed description of various examples, reference will now be made to the accompanying drawings in which.

DETAILED DESCRIPTION

A three-level inverter converts a direct current (DC) voltage (or current) to an alternating current (AC) voltage (or current) using a switching network in which a switch node within the switching network is connected to an inductor and is controlled to three different voltage levels. One type of 3-level inverter is an active neutral point clamped (ANPC) inverter. Another type of inverter is a neutral point clamped (NPC) inverter. An example 3-level NPC inverter includes a switching network having four switches (each switch being a transistor) and two diodes. An example 3-level ANPC inverter has a similar switching network but replaces the diodes with two additional switches (6 switches total). The embodiments described herein are directed to a 3-level ANPC inverter, but the disclosed techniques apply to 3-level NPC inverters as well.

FIGS. 1A-1D illustrate the switching scheme (switches that are on at any point in time are circled, explained below) for a 3-level ANPC inverter including a switch network 100 which includes six switches Q1-Q6, each of which may include one or more transistors. In FIGS. 1A-1D, each switch is illustrated as a transistor (e.g. a power metal-oxide-silicon field effect transistor ("MOSFET")) and a corresponding parasitic body diode of the transistor. The gates of Q1-Q6 are driven by respective gate signals G1-G6. Nodes V+, V− and N are DC input nodes and may be coupled to a DC power grid that includes one or more DC power sources such as solar panels or DC wind turbines. An AC output voltage Vout node may be coupled to an AC power grid, such as a local home power grid, a building power grid, and/or a public utility power grid. The input voltage to the switch network is the DC voltage difference between V+ and V−, and the AC output voltage is Vout. In one example, V+ is +500V with respect to neutral (N) and V− is −500V with respect to N. Thus, the DC input voltage being converted to the AC output voltage is 1000 VDC in this example.

The drain of Q1 is coupled to the V+ and the source of Q4 is coupled to the V−. Q1-Q4 are connected in series between V+ and V−. The source of Q2 is connected to the drain of Q3 at the switch node (SW). The switch node is connected to one terminal of an inductor L1, and the other terminal of the inductor provides Vout. Q5 and Q6 also are connected in series between the drain of Q2 and the source of Q3. The node between the source of Q5 and the drain of Q6 is connected to neutral (N).

Q2 and Q3 are referred to as "inner" switches and are operated at line frequency, which is the frequency of Vout (e.g., 50 Hz, 60 Hz). Depending on whether Vout is in the positive half-cycle or the negative half-cycle, the remaining switches Q1, Q5, Q4, and Q6 are operated at a substantially higher frequency (e.g., 100 KHz). Switches Q1 and Q4 are referred to as "outer" switches.

Figure 1B:
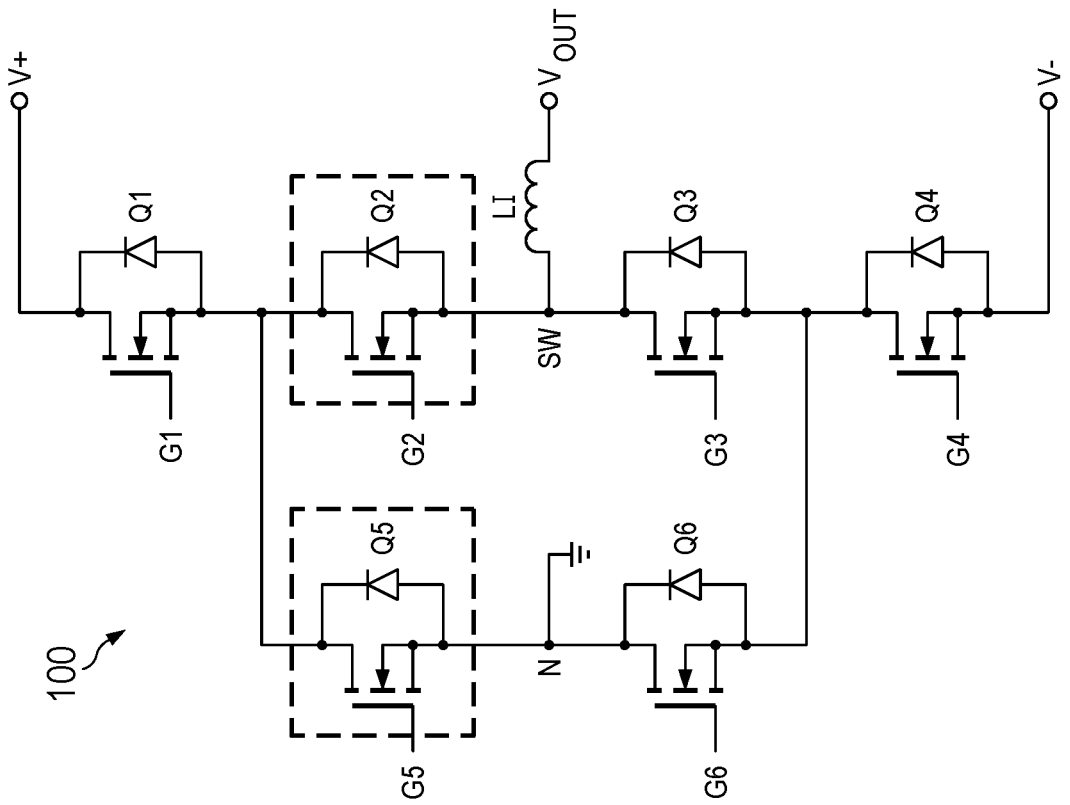
FIGS. 1A-1D illustrate the switching scheme for the switching network of a 3-level inverter in accordance with an example.
Figure 1A:
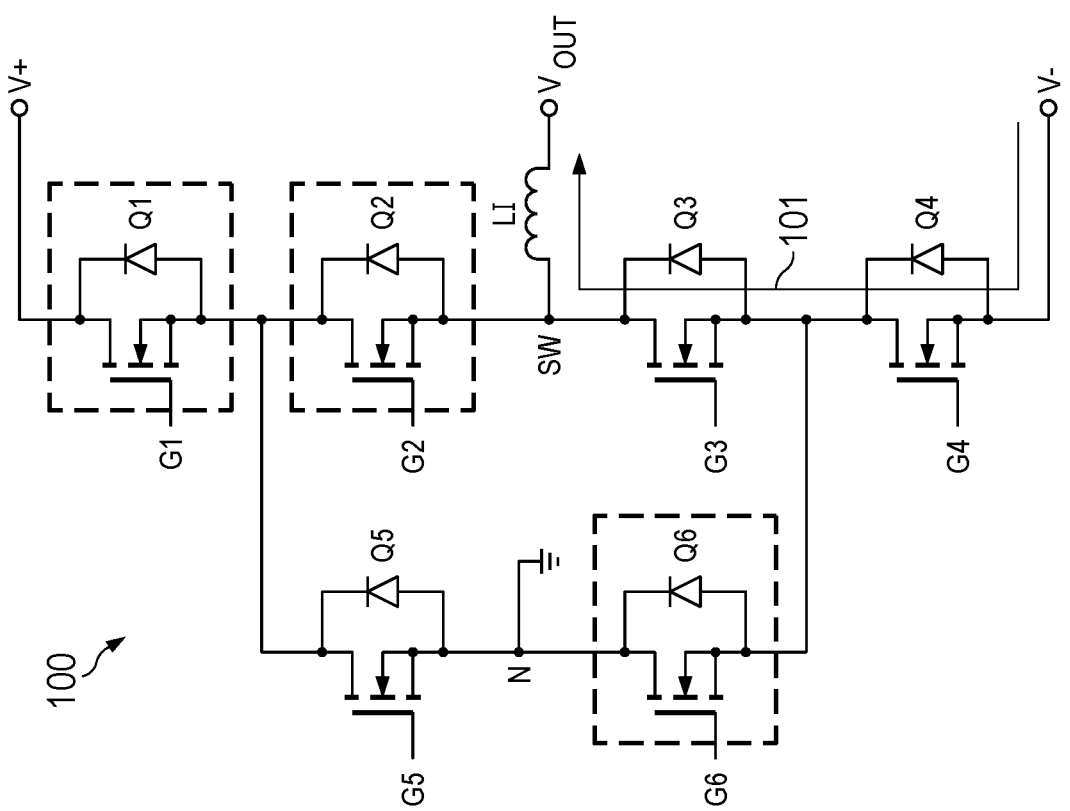

FIGS. 1A and 1B illustrate the operation of the inverter's switching network 100 during the positive half-cycle. During the positive half-cycle Q2 is on (as indicated the circle around Q6) and Q3 and Q4 are off (as indicated by the lack of a circle). Q6 is on and off during the positive half-cycle in sync with Q1 being on and off. Thus, Q6 is on (circled) in FIG. 1A and off (not circled) in FIG. 1B. Q1 and Q5 are operated as a switching pair at the higher frequency. Accordingly, as shown in FIG. 1A, when Q1 is on, Q5 is off, and thus the voltage on the switch node SW is substantially equal to V+. As shown in FIG. 1B, when Q5 is on, Q1 is off, and thus the voltage on the switch node SW is substantially equal to N. Thus, during the positive half-cycle, the configuration of the switch network 100 changes at the higher frequency between the configurations of FIGS. 1A and 1B. During the positive half-cycle, the switch node voltage toggles between V+ and N at the higher frequency.

Figure 1D:
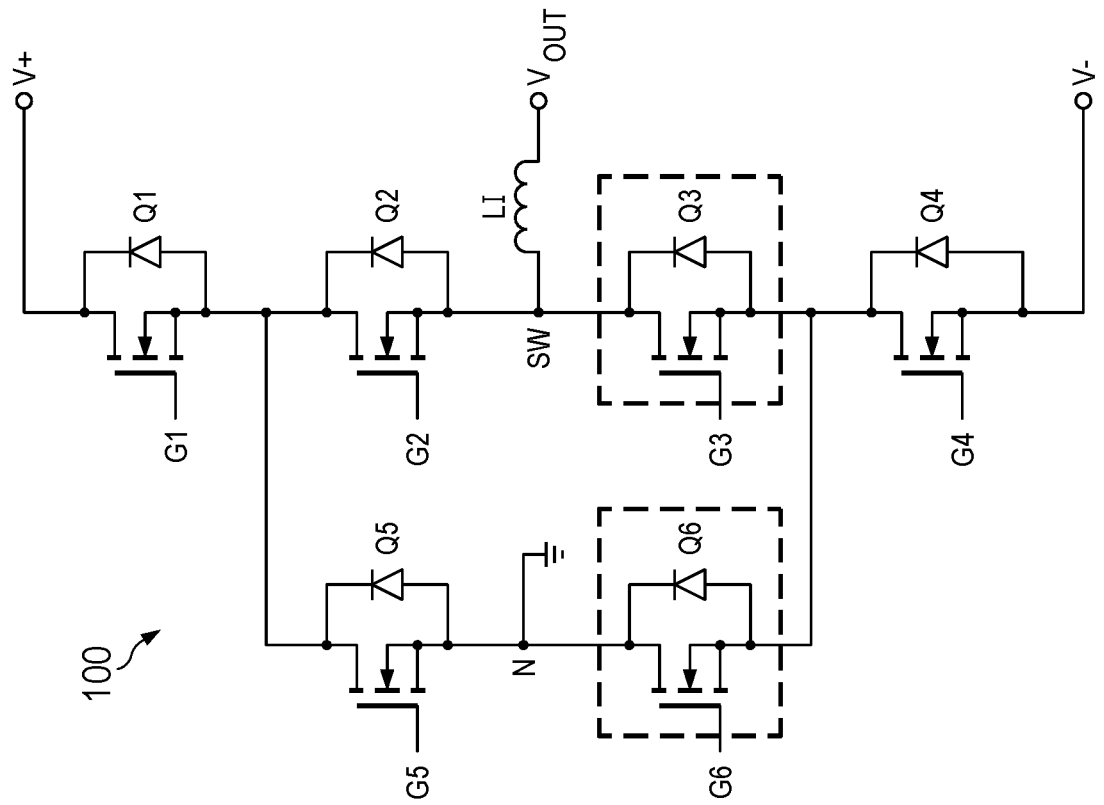
Figure 1C:
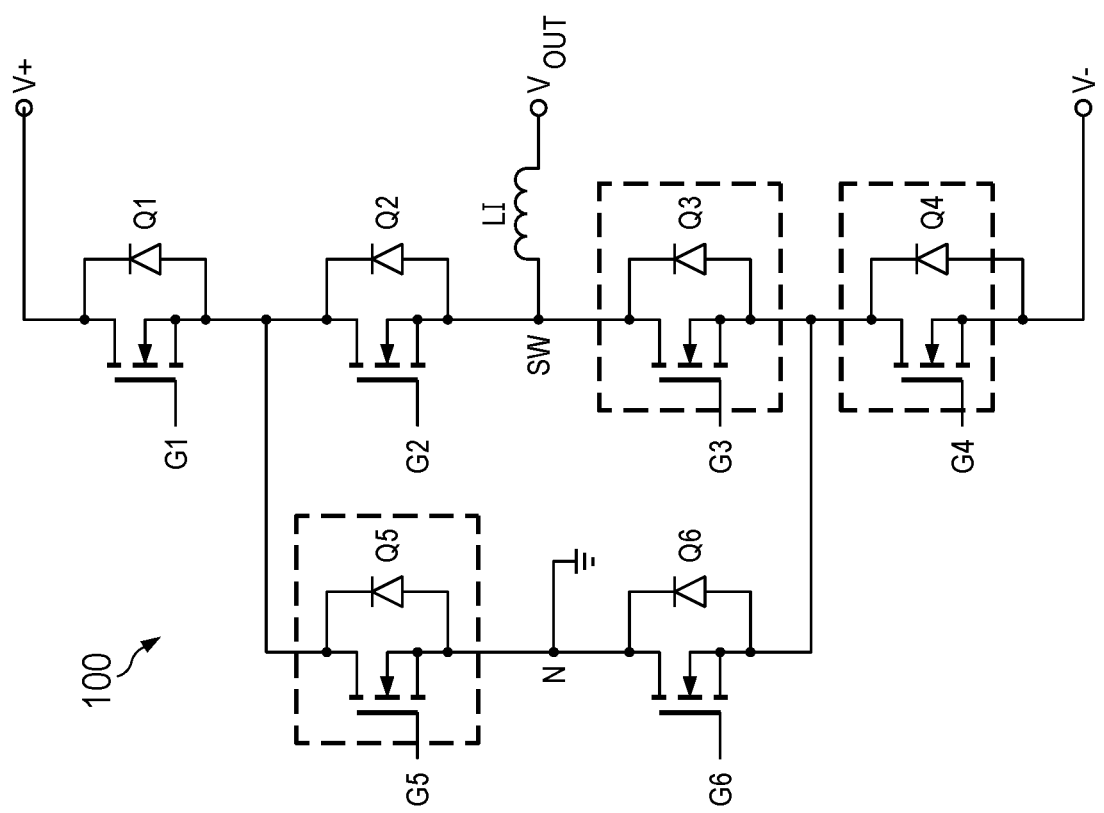

FIGS. 1C and 1D illustrate the switch operation during the negative half-cycle. During the negative half-cycle, Q3 is on and Q1 and Q2 are off. Q4 and Q6 are operated as a switching pair at the higher frequency. Accordingly, as shown in FIG. 1C, when Q4 is on, Q6 is off, and thus the voltage on the switch node SW is substantially equal to V−. As shown in FIG. 1D, when Q6 is on, Q4 is off, and thus the voltage on the switch node SW is substantially equal to N. Q5 is on and off during the negative half-cycle in sync with Q4 being on and off. Thus, Q5 is on (circled) in FIG. 1C and off (not circled) in FIG. 1D. Thus, during the negative half-cycle, the configuration of the switch network 100 changes at the higher frequency between the configurations of FIGS. 1C and 1D. During the negative half-cycle, the switch node voltage toggles between V− and N at the higher frequency.

Each transistor switch (or at least inner switches Q2 and Q3) is rated to support at least a voltage approximately equal to V+. For example, if V+ is 500V, then each transistor is rated for 500V. However, a possibility exists in which the inner switches Q2 and Q3 could have a voltage equal to 2*V across their drain-to-source terminals. If that were to happen, the inner transistors could be damaged. This possible error condition exists in two regards: 1) while powering down the inverter, and 2) during the cross-over points between the positive and negative half-cycles. Referring to FIG. 1A in which Q1 and Q2 are during a portion of the positive half-cycle, if the control logic then changes the configuration to the negative half-cycle (FIG. 1C), it is possible that the drain-to-source voltage (Vds) of Q2 could momentarily be 2*(V+). In FIG. 1A, Q1 is on and thus the voltage on the drain of Q2 is at V+. if Q2 were to be turned off before turning off Q1, because an inductor generally does not experience a discontinuous change in current, current will flow through the body diodes of Q4 and Q3 into the switch node SW and inductor L1, as indicated by arrow 101. If that happens, then the voltage on the switch node SW and thus on the source of Q2 will be V−, and the Vds of Q2 will be the full input voltage 2*(V+). The same problem condition can also occur if the entire inverter is being shut down, and an inner switch is turned off before turning off its respective outer switch partner.

The embodiments described herein prevent this high voltage stress problem from occurring. The embodiments described herein also include a pulse width modulation (PWM) switch logic that controls the six switches while only needing two PWM signal channels for the six-switch switch network 100.

The embodiments described herein are directed to an N-level inverter topology (e.g., N is 3) that extends the turn ON time of the inner switches until a delay timer period after the respective outer switches are turned off. Once the outer switches have been turned off, then the inner switches are turned off after a further delay (referred to herein as "T2") to ensure a safe operation of the inverter (e.g., to avoid the high voltage stress problem noted above). This switching scheme described herein also implements a multiplexer function which advantageously reduces the number of PWM resources needed to control the switches of the switch network 100.

Figure 2:
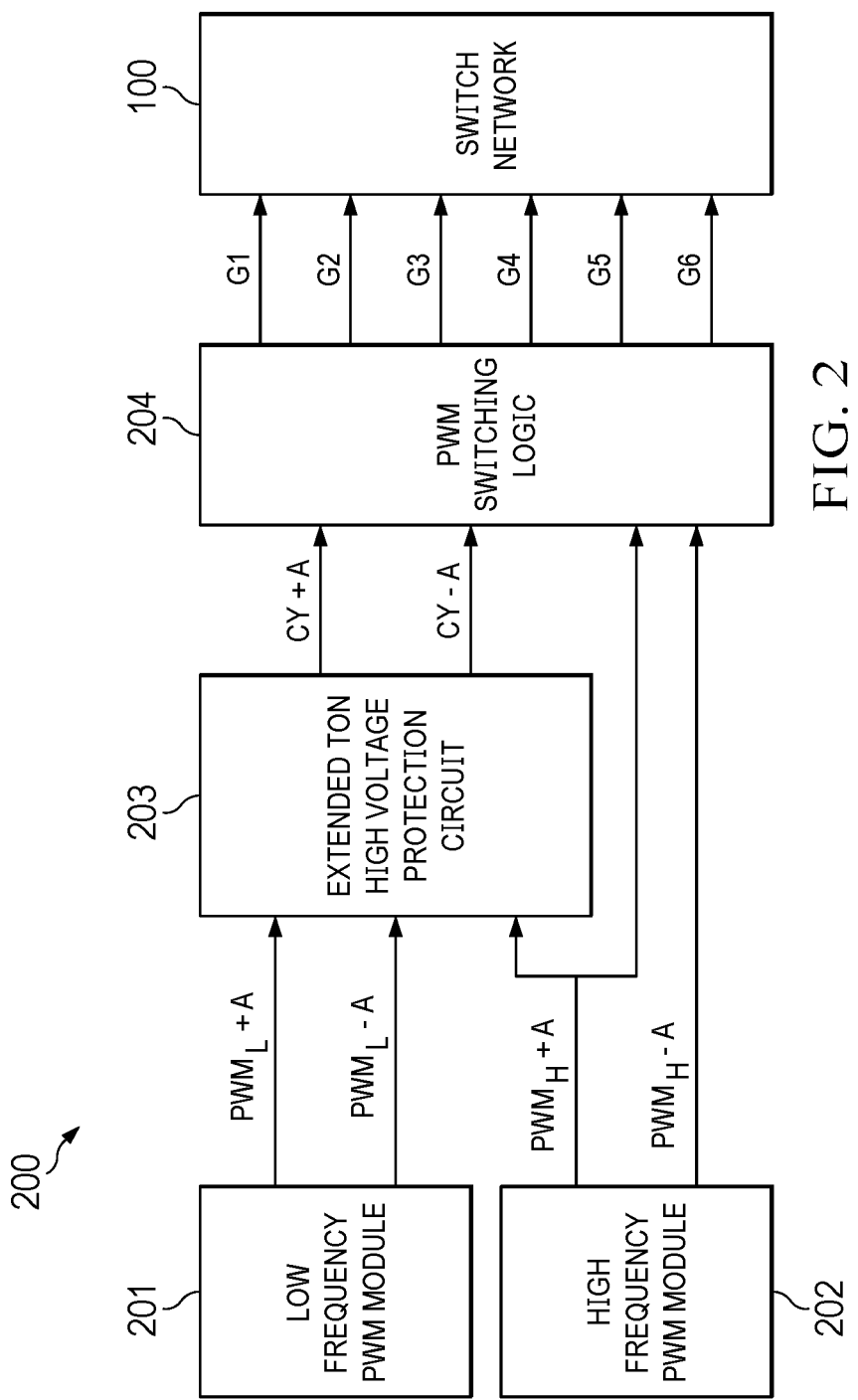
FIG. 2 illustrates at least a portion of control logic for a 3-level inverter, the control logic including an extended Ton high voltage protection circuit and a pulse width modulation (PWM) switching logic in accordance with an example.

FIG. 2 shows an example of an inverter 200 that employs a digital control scheme which includes a low frequency PWM module 201, a high frequency PWM module 202, an extended Ton high voltage (HV) protection circuit 203, PWM switching logic 204, and the switch network 100. Any two or more of the low frequency PWM module 201, the high frequency PWM module 202, the extended Ton high voltage failure protection circuit 203, and the PWM switching logic 204 may be fabricated in the form of an integrated circuit (IC) on a common IC die (e.g., one IC die that includes all of the low and high frequency PWM modules 201 and 202, the extended Ton high voltage protection circuit 203, and the PWM switching logic 204). The switch network 100 may be implemented as transistors separate from die containing the remaining components of FIG. 2.

In this example, the low frequency PWM module 201 generates low frequency (line frequency) output PWM signals designated as PWM_L+A and PWM_L−A. The "L" refers to the signals being low frequency. The "A" refers to the fact that the inverter 200 may be a three-phased inverter and thus has three switch networks 100 (A, B, and C). Only one phase/switch network 100 is shown in FIG. 2. PWM_L+A and PWM_L−A are used to operate the inner complementary switches Q2 and Q3. For example, during the positive half-cycle, PWM_L+A is logic high, PWM_L−A is logic low, Q2 is on and Q3 is off. During the negative half-cycle, PWM_L−A is logic high, PWM_L+A is logic low, Q3 is on and Q2 is off. The PWM_L+A and PWM_L−A low frequency PWM signals from the low frequency PWM module 201 are coupled to the extended Ton high voltage protection circuit 203.

The high frequency PWM module 202 also generates a complementary pair of PWM signals but at the higher frequency (e.g., 100 KHz). The higher frequency, complementary PWM signals are PWM_H+A and PWM_H−A. PWM_H+A is provided to the extended Ton high voltage protection circuit 203. Both the PWM_H+A and PWM_H−A are coupled to the PWM switching logic 204. As explained below, the extended Ton high voltage protection circuit 203 generates low frequency (line frequency) control signals CY+_A and CY−_A in response to the input low frequency signals PWM_L+A and PWM_L−A and the high frequency signal PWM_H+A. As shown in FIG. 3 and explained below, the PWM switching logic 204 includes Boolean logic that generates the gate signals G1-G6 to the six switches of the switch network 100 based on the input signals CY+_A, CY−_A, PWM_H+A, and PWM_H−A. In some embodiments, a driver receives the output signal from the PWM switching logic for a particular transistor and generates the gate signal to drive the gate accordingly. That is, gate drivers may be disposed between the PWM switching logic 204 and the switch network 100, or the gate drivers may be part of the PWM switching network.

Figure 3A:
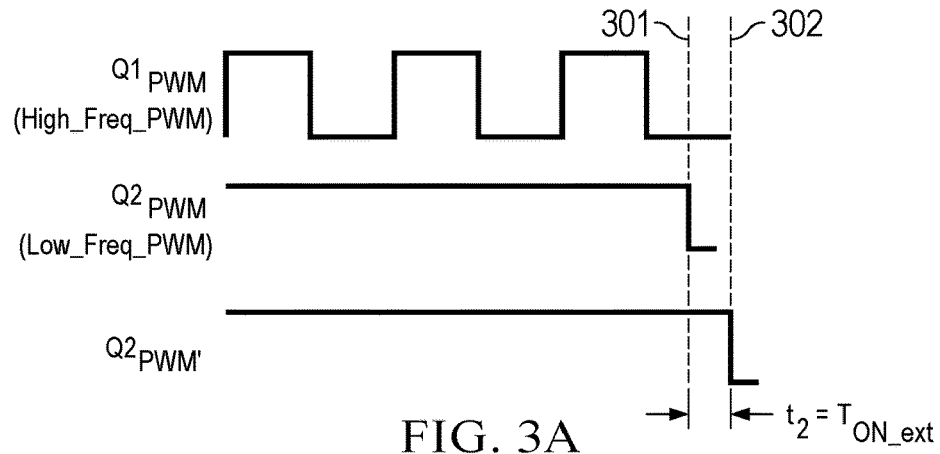
FIGS. 3a and 3b are timing diagrams illustrating the operation of the extended Ton high voltage protection circuit for the 3-level inverter in accordance with an example.
Figure 3B:
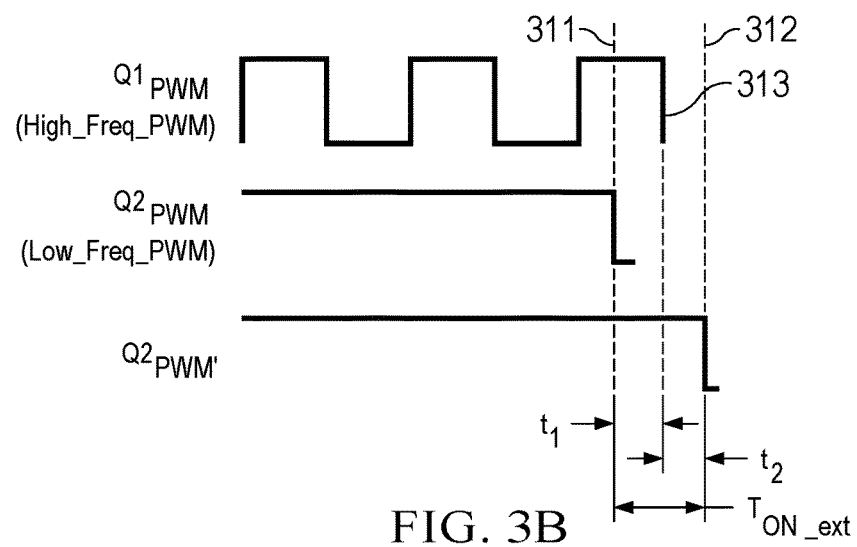

FIGS. 3A and 3B illustrate the operation of the extended Ton high voltage protection circuit 203. The waveforms of FIG. 3A show high frequency PWM signal for controlling, for example, outer switch Q1 and a lower frequency PWM signal for controlling inner switch Q2. Based on the high voltage stress problem explained above, it is desirable not to turn off inner switch Q2 while outer switch Q1 is on. Instead, the high voltage stress problem is prevented if Q2 is turned off after Q1 is turned off. The extended Ton high voltage protection circuit includes logic (e.g., a state machine) and a timer to delay the gate signal to the inner switch from turning off the inner switch. The size of the delay in FIGS. 3A and 3B is T2. In one example, T2 is 20 microseconds.

FIG. 3A is an example (Case 1) in which Q2 is to be turned off when Q1 is presently off as indicated by arrow 301. The extended Ton high voltage protection circuit 203 includes a state machine that detects that Q1 is off when Q2 is to be turned off. The state machine then triggers a timer to measure the T2 delay period, after which the state machine asserts the control signal (G2) for Q2 to turn Q2. Thus, the Q2_PWM' control signal is configured to transition no less than the T2 delay period after the transition of the Q1_PWM control signal that turns Q1 off.

FIG. 3B is an example (Case 2) in which Q2 is to be turned off when Q1 is presently on as indicated by arrow 311. The extended Ton high voltage protection circuit 203 detects that Q1 is on (based on the high frequency PWM_H+A signal being high), which causes its state machine to enter a reset state. The reset state is released responsive to the subsequent falling edge 313 of the gate signal for Q1. Upon exiting the reset state machine initiates the timer to measure the T2 delay period. At the expiration of T2, the gate signal to Q2 transitions to a logic low to thereby turn off Q2. Accordingly, here as well, the Q2_PWM' control signal is configured to transition no less than the T2 delay period after the transition of the Q1_PWM control signal that turns Q1 off.

Figure 4:
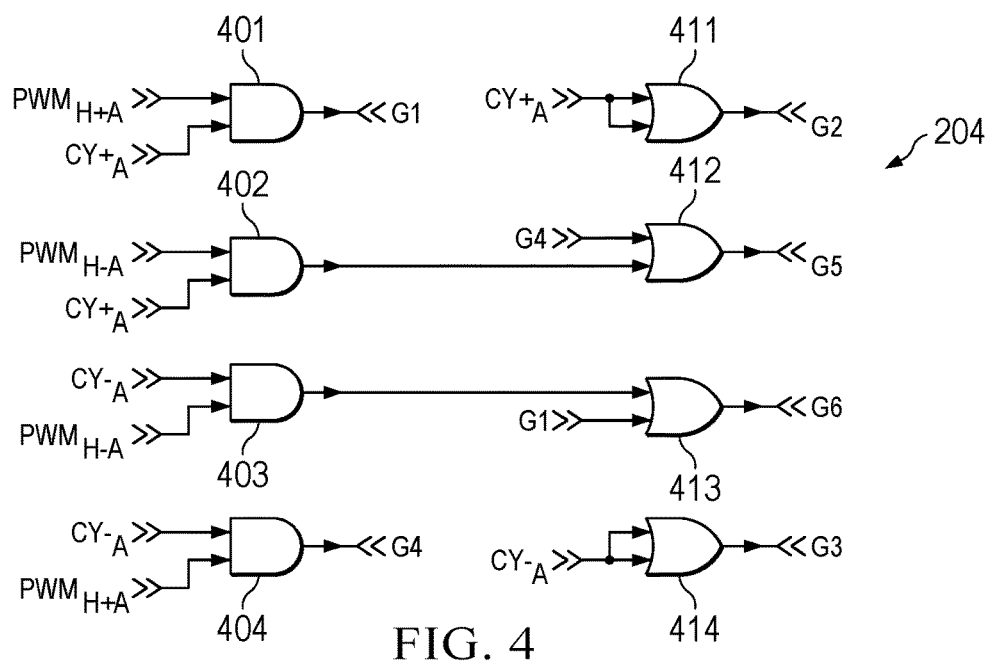
FIG. 4 is a block diagram of the PWM switching logic for the 3-level inverter in accordance with an example.

FIG. 4 is an example implementation of the PWM switching logic 204. The example of FIG. 4 includes AND gates 401, 402, 403, 404 and OR gates 411, 412, 413, and 414. Other types and configuration of logic gates can be used in place of AND gates 401-404 and/or OR gates 411-414. The inputs of AND gate 401 receive the PWM+H_A signal from the high frequency PWM module 104 and the CY+_A signal from the extended Ton high voltage protection circuit 103. The output of AND gate 401 is G1. As explained above, CY+_A is logic high during the positive half-cycle and low during the negative half-cycle. Accordingly, G1 is asserted high to turn on outer switch Q1 during the positive half-cycle and in sync with the logic state of PWM_H+A. That is, when PWM_H+A is high, Q1 is on, and when PWM_H+A is low, Q1 is off.

The inputs of AND gate 404 receive the PWM+_A signal and the CY-_A signal. The output of AND gate 404 is G2. G2 is asserted high to turn on outer switch Q4 during the negative half-cycle and in sync with the logic state of PWM_H+A. That is, during the negative half-cycle when PWM_H+A is high, Q4 is on, and when PWM_H+A is low, Q4 is off. OR gate 411 (used for timing alignment reasons) receives CY+_A on both of its inputs. The output of OR gate 411 is G2. Accordingly, Q2 turns on during the positive half-cycle during which CY+_A is logic high. Similarly, OR gate 414 receives CY-_A on both of its inputs. The output of OR gate 414 is G32. Accordingly, Q3 turns on during the negative half-cycle during which CY-_A is logic high.

The combination of AND gate 402 and OR gate 412 generates G5, the control signal for Q5. The inputs to AND gate 402 include PWM_H-A and CY+_A. The output from AND gate 402 is coupled to an input of OR gate 412 (also used for timing alignment reasons), and G4 (from AND gate 404) is coupled to the other input of OR gate 412. The output of OR gate 412 is G5. G5 is asserted high to turn on Q5 when either of the following two conditions are true: (1) when G4 is high (Q4 is on), and (2) PWM_H-A is high during the positive half-cycle (when CY+_A is high). Accordingly, and also as illustrated in FIGS. 1A-1D, during the positive half-cycle, Q5 turns on and off complementary with Q1, and during the negative half-cycle, Q5 turns on and off in sync with Q4 turning on off.

The combination of AND gate 403 and OR gate 413 generates G6, the control signal for Q6. The inputs to AND gate 403 include PWM_H-A and CY-_A. The output from AND gate 403 is coupled to an input of OR gate 413, and G1 (from AND gate 401) is coupled to the other input of OR gate 413. The output of OR gate 413 is G6. G6 is asserted high to turn on Q6 when either of the following two conditions are true: (1) when G1 is high (Q1 is on), and (2) PWM_H-A is high during the positive half-cycle (when CY-_A is high). Accordingly, and also as illustrated in FIGS. 1A-1D, during the negative half-cycle, Q6 turns on and off complementary with Q4, and during the positive half-cycle, Q6 turns on and off in sync with Q1 turning on off.

The PWM switching logic 204 of FIG. 4 advantageously generates all six control signals for the switches of the switch network 100 while only using one complementary pair of high frequency PWM signals (PWM_H+A and PWM_H-A) and one pair of low frequency PWM signals (PWM_L+A and PWM_L-A). Other implementations of 3-level inverter may require three complementary pairs of PWM signals—one low frequency pair and two high frequency pairs for driving the sets of high frequency switching switches Q1/Q5 and Q4/Q6. The PWM switching logic takes advantages of the fact that when one high frequency switching pair is switching at the higher frequency, the other pair is not also operating in a high frequency reciprocal fashion.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type MOSFET may be used in place of an n-type MOSFET with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. A circuit, comprising:
    a first pulse width modulation (PWM) module configured to produce a first pair of complementary PWM signals including a first signal and a second signal;
    a second PWM module configured to produce a second pair of complementary PWM signals including a third signal and a fourth signal;
    a logic circuit coupled to the first and second PWM modules and configured to produce a fifth signal and a sixth signal, wherein a transition of the fifth signal is delayed with respect to a transition of the first signal, and a transition of the sixth signal is delayed with respect to a transition of the second signal, based on the third signal; and
    PWM switching logic coupled to the logic circuit and a switch network, wherein the switch network includes first, second, third, and fourth switches coupled in series between a first voltage terminal and a second voltage terminal, and wherein the PWM switching logic is configured to produce respective control signals for the first, second, third, and fourth switches based on the third, fourth, fifth, and sixth signals.

2. The circuit of claim 1, wherein the switch network further includes fifth and sixth switches coupled in series, the series combination of the fifth and sixth switches being in parallel across the second and third switches, and wherein the PWM switching logic is further configured to produce respective control signals for the fifth and sixth switches based on the third, fourth, fifth, and sixth signals.

3. The circuit of claim 2, wherein the switch network is an active neutral point clamped (ANPC) inverter.

4. The circuit of claim 2, wherein the PWM switching logic includes:
    a first logic gate configured to produce the control signal for the first switch, the first logic gate having first and second inputs, the first input of the first logic gate coupled to the third signal, and the second input of the first logic gate coupled to the fifth signal;
    a second logic gate configured to produce the control signal for the fourth switch, the second logic gate having first and second inputs, the first input of the second logic gate coupled to the third signal, and the second input of the second logic gate coupled to the sixth signal;
    a third logic gate configured to produce the control signal for the second switch, the third logic gate having an input coupled to the fifth signal; and
    a fourth logic gate configured to produce the control signal for the third switch, the fourth logic gate having an input coupled to the sixth signal.

5. The circuit of claim 4, wherein the first and second logic gates are AND gates, and the third and fourth logic gates are OR gates.

6. The circuit of claim 4, wherein the PWM switching logic further includes:
    a fifth logic gate having first and second inputs and an output, the first input of the fifth logic gate coupled to the fourth signal, and the second input of the fifth logic gate coupled to the fifth signal;
    a sixth logic gate configured to produce the control signal for the fifth switch, the sixth logic gate having first and second inputs, the first input of the sixth logic gate coupled to the control signal produced by the second logic gate, and the second input of the sixth logic gate coupled to the output of the fifth logic gate;
    a seventh logic gate having first and second inputs and an output, the first input of the seventh logic gate coupled to fourth signal, and the second input of the seventh logic gate coupled to the sixth signal; and
    an eighth logic gate configured to produce the control signal for the sixth switch, the eighth logic gate having first and second inputs, the first input of the eighth logic gate coupled to the output of the seventh logic gate, and the second input of the eighth logic gate coupled to the control signal produced by the first logic gate.

7. The circuit of claim 6, in which the first, second, fifth, and seventh logic gates are AND gates, and the third, fourth, sixth, and eighth logic gates are OR gates.

8. The circuit of claim 1, wherein the logic circuit is configured to:
    determine whether the first signal is in a specific state; and
    initiate a delay of the transition of the fifth signal with respect to the transition of the first signal based on a determination that the first signal is in the specific state.

9. The circuit of claim 8, wherein the logic circuit includes a timer configured to implement the delay of the transition of the fifth signal with respect to the transition of the first signal.

10. The circuit of claim 1, wherein:
    the first and second signals have a first frequency; and
    the third and fourth signals have a second frequency that is greater than the first frequency.

11. A system comprising:
    a switch network including first, second, third, and fourth switches coupled in series between a first voltage terminal and a second voltage terminal;
    a first pulse width modulation (PWM) module configured to produce first and second complementary PWM signals;
    a second PWM module configured to produce a third and fourth complementary PWM signals;
    PWM switching logic coupled to the first and second PWM modules and the switch network, the PWM switching logic configured to produce respective control signals for the first, second, third, and fourth switches in response to the first and second complementary PWM signals and the third and fourth complementary PWM signals; and
    an extended Ton protection circuit coupled between the first PWM module and the PWM switching logic, the extended Ton protection circuit having an input configured to receive the third complementary PWM signal, and the extended Ton protection circuit configured to delay turning off the second switch after the first switch is turned off, and delay turning off the third switch after the fourth switch is turned off.

12. The circuit system of claim 11, wherein the extended Ton protection circuit includes a timer to implement a delay in turning off the second and third switches.

13. The circuit system of claim 11, wherein the switch network is an active neutral point clamped (ANPC) inverter.

14. The circuit system of claim 11, wherein the switch network further includes fifth and sixth switches coupled in series, the series combination of the fifth and sixth switches being in parallel across the second and third switches, and the PWM switching logic configured to produce respective control signals for the fifth and sixth switches in response to the first and second complementary PWM signals and the third and fourth complementary PWM signals.

15. The circuit system of claim 14, wherein the PWM switching logic includes:
   a first logic gate having first and second inputs, the first input of the first logic gate coupled to the third complementary PWM signal, and the second input of the first logic gate coupled to a signal produced based on the first complementary PWM signal;
   a second logic gate having first and second inputs, the first input of the second logic gate coupled to the fourth complementary PWM signal, and the second input of the second logic gate coupled to the signal produced based on the first complementary PWM signal; and
   a third logic gate having first and second inputs, the second input of the third logic gate coupled to an output of the second logic gate, and the third logic gate having an output configured to produce the control signal for the fifth switch.

16. The circuit system of claim 15, wherein the first and second logic gates are AND gates, and the third logic gate is an OR gate.

17. The circuit system of claim 15, wherein the PWM switching logic further includes:
   a fourth logic gate having first and second inputs, the first input of the fourth logic gate coupled to a signal produced based on the second complementary PWM signal, the second input of the fourth logic gate coupled to the third complementary PWM signal, and the fourth logic gate having an output coupled to the first input of the third logic gate.

18. The circuit system of claim 17, wherein the first, second, and fourth logic gates are AND gates, and the third logic gate is an OR gate.

19. A control circuit for an inverter, comprising:
   a first pulse width modulation (PWM) module configured to produce first and second complementary PWM signals;
   a second PWM module configured to produce third and fourth complementary PWM signals;
   PWM switching logic coupled to the first and second PWM modules and a switch network, the switch network including first, second, third, and fourth switches coupled in series between a first voltage terminal and a second voltage terminal, and the PWM switching logic configured to produce respective control signals for ach of the first, second, third, and fourth switches in response to the first and second complementary PWM signals and the third and fourth complementary PWM signals; and
   an extended Ton protection circuit coupled between the first PWM module and the PWM switching logic, the extended Ton protection circuit having an input configured to receive the third complementary PWM signal, and the extended Ton protection circuit configured to delay turning off the second switch after the first switch is turned off, and delay turning off the third switch after the fourth switch is turned off.

20. The control circuit of claim 19, wherein the switch network includes fifth and sixth switches, and the PWM switching logic is configured to generate respective control signals for the fifth and sixth switches in response to the first and second complementary PWM signals and the third and fourth complementary PWM signals.

* * * * *